United States Patent
Zhao et al.

(10) Patent No.: US 9,473,648 B2
(45) Date of Patent: Oct. 18, 2016

(54) NEXT GENERATION FORM FACTOR INTERFACE PREVENTING LARGE TRANSIENT CURRENT DURING HOT PLUGGING

(71) Applicant: HUIZHOU TCL MOBILE COMMUNICATION CO., LTD., Huizhou (CN)

(72) Inventors: Shiqing Zhao, Huizhou (CN); Dexiang Luo, Huizhou (CN); Xuelong Hu, Huizhou (CN)

(73) Assignee: HUIZHOU TCL MOBILE COMMUNICATION CO., LTD., Huizhou (CN)

( * ) Notice: Subject to any disclaimer, the term of this patent is extended or adjusted under 35 U.S.C. 154(b) by 66 days.

(21) Appl. No.: 14/419,040

(22) PCT Filed: Aug. 16, 2013

(86) PCT No.: PCT/CN2013/081637
§ 371 (c)(1),
(2) Date: Feb. 2, 2015

(87) PCT Pub. No.: WO2014/205902
PCT Pub. Date: Dec. 31, 2014

(65) Prior Publication Data
US 2015/0222761 A1    Aug. 6, 2015

(30) Foreign Application Priority Data

Jun. 26, 2013  (CN) .......................... 2013 1 0258343

(51) Int. Cl.
*H04M 19/08* (2006.01)
*H01H 7/00* (2006.01)
(Continued)

(52) U.S. Cl.
CPC .............. *H04M 19/08* (2013.01); *H01H 7/00* (2013.01); *H04M 1/0262* (2013.01); *H05K 1/117* (2013.01); *H05K 2201/094* (2013.01)

(58) Field of Classification Search
CPC .. H01H 7/00; H05K 1/117; H05K 2201/094; G06F 13/4081; G06F 13/14
See application file for complete search history.

(56) References Cited

U.S. PATENT DOCUMENTS

| | | | |
|---|---|---|---|
| 5,210,855 A * | 5/1993 | Bartol | G06F 13/4081 710/107 |
| 5,317,697 A * | 5/1994 | Husak | G06F 13/4072 370/217 |

(Continued)

FOREIGN PATENT DOCUMENTS

| | | |
|---|---|---|
| CN | 101969192 A | 2/2011 |
| CN | 201984507 U | 9/2011 |

(Continued)

OTHER PUBLICATIONS

Machine translation (Google Patent) of applicant cited document, Huizhou TCL Mobile, Zhao et al., CN 101969192.*

*Primary Examiner* — Bobbak Safaipour
*Assistant Examiner* — Devan Sandiford
(74) *Attorney, Agent, or Firm* — Shimokaji IP

(57) ABSTRACT

A communication module and corresponding portable terminal are provided. The communication module includes an NGFF interface, a switch unit, a charge protection unit, and a delay unit. The switch unit is for controlling connection and disconnection of a power supply between a power supply end of the communication module and the power supply pins. The charge protection unit is for power charging when the switch unit is turned off, and for eliminating an impact current generated at the instant when the switch unit is turning on. The delay unit is for controlling the switch unit's delay turning on. The communication module and corresponding portable terminal are able to ensure the integrality and stability of data.

6 Claims, 3 Drawing Sheets

(51) Int. Cl.
*H05K 1/11* (2006.01)
*H04M 1/02* (2006.01)

(56) References Cited

U.S. PATENT DOCUMENTS

| | | | | |
|---|---|---|---|---|
| 5,432,916 A * | 7/1995 | Hahn | ............ | G06F 13/4081 |
| | | | | 361/791 |
| 5,511,171 A * | 4/1996 | Bowman | ............ | G06F 13/4081 |
| | | | | 710/302 |
| 5,526,493 A * | 6/1996 | Shu | ............ | G06F 1/1632 |
| | | | | 361/679.41 |
| 5,538,436 A * | 7/1996 | Garney | ............ | H05K 5/0295 |
| | | | | 361/679.32 |
| 5,572,141 A * | 11/1996 | Hutton | ............ | G01R 1/0416 |
| | | | | 324/73.1 |
| 5,636,347 A * | 6/1997 | Muchnick | ............ | G06F 13/4072 |
| | | | | 710/302 |
| 5,740,378 A * | 4/1998 | Rehl | ............ | G06F 13/409 |
| | | | | 710/302 |
| 5,862,350 A * | 1/1999 | Coulson | ............ | G06F 13/4081 |
| | | | | 710/302 |
| 5,909,065 A * | 6/1999 | Jones | ............ | H02H 9/004 |
| | | | | 307/147 |
| 5,964,855 A * | 10/1999 | Bass | ............ | G06F 13/4081 |
| | | | | 710/302 |
| 6,125,417 A * | 9/2000 | Bailis | ............ | G06F 13/4081 |
| | | | | 710/302 |
| 6,157,974 A * | 12/2000 | Gasparik | ............ | G06F 13/4081 |
| | | | | 710/302 |
| 6,988,157 B2 * | 1/2006 | Lecourtier | ............ | G06F 13/4081 |
| | | | | 710/302 |
| 2005/0122645 A1 * | 6/2005 | Ker | ............ | H05K 1/0259 |
| | | | | 361/56 |
| 2005/0241848 A1 * | 11/2005 | Michaud | ............ | H05K 3/242 |
| | | | | 174/250 |
| 2006/0082976 A1 * | 4/2006 | Berberich | ............ | H05K 1/162 |
| | | | | 361/720 |
| 2007/0218725 A1 * | 9/2007 | Liao | ............ | H01R 13/6585 |
| | | | | 439/157 |
| 2008/0133802 A1 | 6/2008 | Nagamine | | |
| 2011/0026213 A1 * | 2/2011 | Chang | ............ | G06F 1/186 |
| | | | | 361/679.31 |
| 2011/0113174 A1 * | 5/2011 | Fang | ............ | G06F 13/4081 |
| | | | | 710/300 |
| 2013/0346778 A1 * | 12/2013 | Boom | ............ | G06F 1/32 |
| | | | | 713/323 |
| 2014/0244881 A1 * | 8/2014 | Stewart | ............ | G06F 13/4081 |
| | | | | 710/302 |
| 2014/0285280 A1 * | 9/2014 | Chuo | ............ | H01P 3/02 |
| | | | | 333/5 |
| 2015/0205337 A1 * | 7/2015 | Zhao | ............ | G06F 13/4068 |
| | | | | 713/330 |

FOREIGN PATENT DOCUMENTS

CN 102681963 A 9/2012
CN 103064489 A 4/2013

* cited by examiner

200~# NEXT GENERATION FORM FACTOR INTERFACE PREVENTING LARGE TRANSIENT CURRENT DURING HOT PLUGGING

TECHNICAL FIELD

The present disclosure relates to communication technologies, and more particularly, relates to a communication module and corresponding portable terminal.

BACKGROUND

Current communication modules are usually a 3G (3rd Generation, the third generation mobile communication technology) module or a 4G (4th Generation, the fourth generation mobile communication technology) module, which are generally assembled in smart terminals, such as mobile phones, tablet computers, and the like. When a communication module is connected to an internal control system, connection to a network can be achieved. A size and interface mode of a 3G/4G module will directly affect a size and connection mode of a corresponding smart terminal which has been assembled with the 3G/4G module. In particular, portable smart terminals have high requirements for a size and interface of a 3G/4G module.

However, currently available 3G/4G modules usually adopt a Mini-PCIe (Mini Peripheral Component Interconnect Express) interface. A Mini-PCIe interface has a relatively large volume, and thus cannot meet requirements of current portable smart terminals. In addition, when in use, a 3G/4G module generally needs to be hot plugged in and unplugged from a Mini-PCIe connector in the terminal. In other words, a 3G/4G module is plugged into, and/or unplugged from, a corresponding terminal when the power is still on, which allows users to remove or replace the 3G/4G module without shutting down the system and without turning off the power. In such mode, only a simple action of plugging or unplugging is necessary for removing the 3G/4G module; while the system keeps running without interruption. Thereby, the system's capability for timely recovery from a disaster, as well as, the system's extendibility and flexibility, are improved.

However, during hot plugging and unplugging, current 3G/4G modules have the problems set forth below:

1. USB (Universal Serial BUS) interface data corruption. With respect to a design of a PCB (Printed Circuit Board) of current 3G/4G modules, lengths of all signal and data pins are the same, such as a length of USB data interface's D+ (positive data) pin and D− (negative data) pin and a length of a power supply pin are the same. In this regard, when the 3G/4G module is unplugged, USB communication and data transmissions are disconnected at the same time. While, at that same time, data may still be under transmission. Accordingly, an associated host system may not have enough time to save the data, which may result in partial data loss.

2. Power interface generating large instantaneous current. When a 3G/4G module is plugged in, a power supply voltage in a host system will be immediately applied to a power supply end of the 3G/4G module, so as to generate a large instantaneous current. The large current may burn some elements in the power module of the 3G/4G module, and further lead to malfunction or even crash of the system.

SUMMARY

In view of the deficiencies in the existing technologies, a communication module, and a corresponding portable terminal, are provided to solve problems associated with currently available communication modules, such as large volume, as well as, during hot plugging and unplugging, a potential for data loss and large instantaneous current may occur, which may negatively impact system stability.

In order to achieve the above mentioned objects, the technical solutions set forth below are provided:

A communication module includes an NGFF interface having power supply pins; and universal serial bus (USB) data transmission pins; wherein a length of the universal serial bus (USB) data transmission pins is shorter than a length of the power supply pins; a switch unit for controlling connection and disconnection of electrical power between a power supply end of the communication module and the power supply pins; a charge protection unit for power charging when the switch unit is turned off, and for eliminating an impact current generated at an instant when the switch unit is turning on; and a delay unit for controlling a switch unit turn on delay; wherein the switch unit, the charge protection unit and the delay unit are connected to the power supply pins of the NGFF interface, and wherein the switch unit is connected to the power supply end through the charge protection unit; the switch unit is a metal oxide semiconductor; wherein a source electrode of the metal oxide semiconductor is connected to the power supply pins of the NGFF interface, a first input end of the charge protection unit, and a first end of the delay unit, wherein a gate electrode of the metal oxide semiconductor is connected to a second end of the delay unit, and wherein a drain electrode of the metal oxide semiconductor is connected to a second input end of the charge protection unit; wherein the length of the universal serial bus (USB) data transmission pins is longer than or equal to two thirds of the length of the power supply pins−0.1 mm, and is shorter than or equal to two thirds of the length of the power supply pins+0.1 mm; the communication module includes a printed circuit board (PCB) having an electronic components layout area, and a shield covering the electronic components layout area.

In another embodiment of a communication module, a charge protection unit includes a first resistor; a first capacitor; and a second capacitor; wherein a first connection end of the first resistor is connected to a source electrode of a metal oxide semiconductor, power supply pins of a NGFF interface and a first end of a delay unit, wherein a second connection end of the first resistor is connected to a drain electrode of the metal oxide semiconductor, one end of the first capacitor, a positive electrode of the second capacitor and a power supply end of the communication module; and wherein both another end of the first capacitor and a negative electrode of the second capacitor are grounded; the delay unit comprising a second resistor; and a third capacitor; wherein a third connection end of the second resistor is connected to the gate electrode of the metal oxide semiconductor, and, via a third capacitor, a third connection end of the second resistor is connected to the first connection end of the first resistor, the source electrode of the metal oxide semiconductor and the power supply pins of the NGFF interface, and wherein a fourth connection end of the second resistor is grounded.

In a further embodiment of a communication module, a NGFF interface includes at least one radio frequency (RF) pin; and at least two ground pins; wherein the ground pins are arranged at two sides of the radio frequency (RF) pin; wherein for each radio frequency (RF) pin, there are two ground pins arranged at each of the two sides of the radio frequency (RF) pin.

In yet another embodiment, a communication module includes an NGFF interface having power supply pins; and universal serial bus (USB) data transmission pins; wherein a length of the universal serial bus (USB) data transmission pins is shorter than a length of the power supply pins; a switch unit for controlling connection and disconnection of electric power between a power supply end of the communication module and the power supply pins; a charge protection unit for power charging when the switch unit is turned off, and for eliminating an impact current generated at an instant when the switch unit is turning on; and a delay unit for controlling a switch unit turn on delay; wherein the switch unit, the charge protection unit and the delay unit are connected to the power supply pins of the NGFF interface, and wherein the switch unit is connected to the power supply end through the charge protection unit.

In yet a further embodiment of a communication module, a switch unit is a metal oxide semiconductor; wherein a source electrode of the metal oxide semiconductor is connected to power supply pins of a NGFF interface, a first input end of a charge protection unit, and a first end of a delay unit, wherein a gate electrode of the metal oxide semiconductor is connected to a second end of the delay unit, and wherein a drain electrode of the metal oxide semiconductor is connected to a second input end of the charge protection unit.

In another embodiment of a communication module, a charge protection unit includes a first resistor; a first capacitor; and a second capacitor; wherein a first connection end of the first resistor is connected to a source electrode of a metal oxide semiconductor, power supply pins of a NGFF interface and a first end of a delay unit, wherein a second connection end of the first resistor is connected to a drain electrode of the metal oxide semiconductor, one end of the first capacitor, a positive electrode of the second capacitor and the power supply end of the communication module; wherein both another end of the first capacitor and a negative electrode of the second capacitor are grounded.

In a further embodiment of a communication module, a delay unit includes a second resistor; and a third capacitor; wherein a third connection end of the second resistor is connected to a gate electrode of a metal oxide semiconductor, and, via the third capacitor, the third connection end of the second resistor is also connected to a first connection end of a first resistor, a source electrode of the metal oxide semiconductor and power supply pins of a NGFF interface, and wherein a fourth connection end of the second resistor is grounded.

In yet another embodiment of a communication module, a NGFF interface includes at least one radio frequency (RF) pin; and at least two ground pins; wherein the ground pins are arranged at two sides of the radio frequency (RF) pin.

In yet a further embodiment of a communication module, for each radio frequency (RF) pin, there are two ground pins arranged at each of two sides of a radio frequency (RF) pin.

In another embodiment of a communication module, a length of universal serial bus (USB) data transmission pins is longer than or equal to two thirds of a length of power supply pins−0.1 mm, and is shorter than or equal to two thirds of the length of the power supply pins+0.1 mm.

In a further embodiment of a communication module, the communication module includes a printed circuit board (PCB) having an electronic components layout area, and a shield covering the electronic components layout area.

In yet another embodiment, a portable terminal includes a control system, and a communication module connected to the control system, the communication module includes an NGFF interface having power supply pins; and universal serial bus (USB) data transmission pins; wherein a length of the universal serial bus (USB) data transmission pins is shorter than a length of the power supply pins; a switch unit for controlling connection and disconnection of electric power between a power supply end of the communication module and the power supply pins; a charge protection unit for power charging when the switch unit is turned off, and for eliminating an impact current generated at an instant when the switch unit is turning on; and a delay unit for controlling a switch unit turn on delay; wherein the switch unit, the charge protection unit and the delay unit are connected to the power supply pins of the NGFF interface, and wherein the switch unit is connected to the power supply end of the communication module through the charge protection unit.

In yet a further embodiment of a portable terminal, a switch unit is a metal oxide semiconductor; wherein a source electrode of the metal oxide semiconductor is connected to power supply pins of a NGFF interface, a first input end of a charge protection unit, and a first end of a delay unit, wherein a gate electrode of the metal oxide semiconductor is connected to a second end of the delay unit, and wherein a drain electrode of the metal oxide semiconductor is connected to a second input end of a charge protection unit.

In another embodiment of a portable terminal, a charge protection unit includes a first resistor; a first capacitor; and a second capacitor; wherein a first connection end of the first resistor is connected to a source electrode of a metal oxide semiconductor, power supply pins of a NGFF interface and a first end of a delay unit, and wherein a second connection end of the first resistor is connected to a drain electrode of the metal oxide semiconductor, one end of the first capacitor, a positive electrode of the second capacitor and a power supply end of a communication module; wherein both another end of the first capacitor and a negative electrode of the second capacitor are grounded.

In a further embodiment of a portable terminal, a delay unit includes a second resistor; and a third capacitor; wherein a third connection end of the second resistor is connected to a gate electrode of a metal oxide semiconductor, and, via the third capacitor, the third connection end of the second resistor is connected to a first connection end of the first resistor, a source electrode of the metal oxide semiconductor and power supply pins of a NGFF interface, and wherein a fourth connection end of the second resistor is grounded.

In yet another embodiment of a portable terminal, a NGFF interface includes at least one radio frequency (RF) pin; and at least two ground pins; wherein the ground pins are arranged at two sides of the radio frequency (RF) pin.

In yet a further embodiment of a portable terminal, for each radio frequency (RF) pin, there are two ground pins arranged at each of two sides of the radio frequency (RF) pin.

In another embodiment of a portable terminal, a length of universal serial bus (USB) data transmission pins is longer than or equal to two thirds of a length of power supply pins−0.1 mm, and is shorter than or equal to two thirds of the length of the power supply pins+0.1 mm.

In a further embodiment of a portable terminal, a communication module includes a printed circuit board (PCB) having an electronic components layout area, and a shield covering the electronic components layout area.

In yet another embodiment of a portable terminal, a communication module includes power elements or structural elements arranged in a control system, and are connected to a printed circuit board (PCB) of the communication module through a NGFF interface.

In comparison with existing technologies, providing an NGFF interface in a communication module helps to reduce a volume of the communication module, the communication module and the corresponding portable terminal are able to reduce a structural limitation for assembly of the communication module and the portable terminal. In addition, with the configuration that a length of universal serial bus (USB) data transmission pins is shorter than a length of power supply pins, a portable terminal is able to save USB data in advance of having electrical power removed, and/or may get power ready, and then may perform USB disconnection or may start to communicate, respectively. Thereby, integrity and stability of data is improved. In addition, when a communication module is being plugged in, due to the pre-charge with small current performed by the charge protection unit, an impact current, which may be generated at an instant when the switch unit is turning on, is eliminated, which protects the switch unit from being damaged by the large instantaneous current which, otherwise, would be generated. Therefore, it has improved the stability and reliability of the system.

DETAIL DESCRIPTION

A communication module and corresponding portable terminal are provided. In order to make the aim, technical solution and technical effect clear and definite, exemplary embodiments are described with reference to the accompanying drawings. It should be understood that the exemplary embodiments are for illustrative purposes only, and are not intended to limit the scope of the appending claims in any way.

A communication module may be a 3G module, a 4G module, etc, which may be inserted into a smart terminal (e.g., a portable terminal, such as a mobile phone, a tablet computer, or the like) and other portable terminals, so as to achieve network connection. The communication module may utilize a small size NGFF (Next Generation Form Factor) interface, and a corresponding NGFF connector may be provided in an associated portable terminal. The communication module may not only have the feature of being compatible with a standard NGFF interface, but may also have significantly smaller volume, as well as, may be able to meet a requirement of hot plugging and unplugging. Therefore, the communication module may be able to fully meet the requirements for 4G and 3G modules of future smart terminals and other devices.

Figure 1:
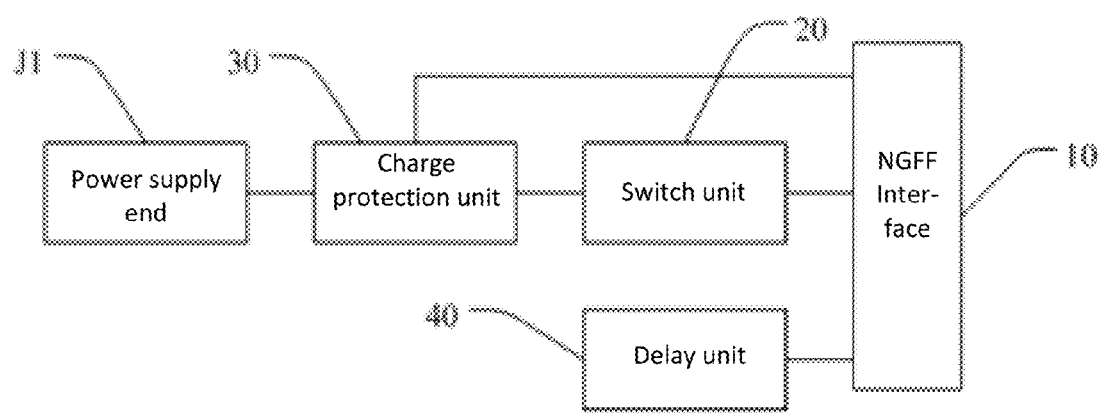
FIG. 1 depicts a block diagram of the structural mechanism of the communication module provided in the present invention.
Figure 2:
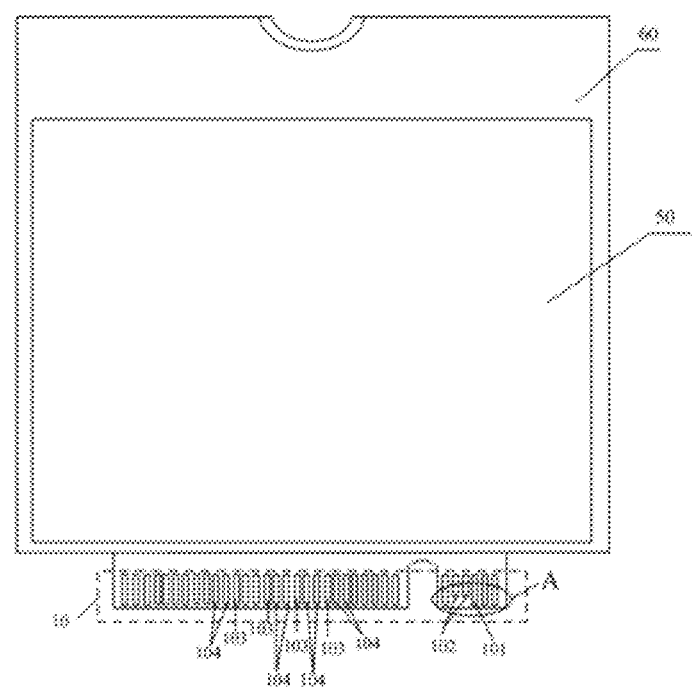
FIG. 2 depicts a main structural view of the communication module provided in the present invention.

With reference to FIG. 1, a block diagram of a structural mechanism of a communication module is depicted. With reference to FIG. 2, a main structural view of a communication module is depicted with reference to FIG. 3, a rear structural view of With reference to FIG. 2, communication module is depicted.

Figure 3:
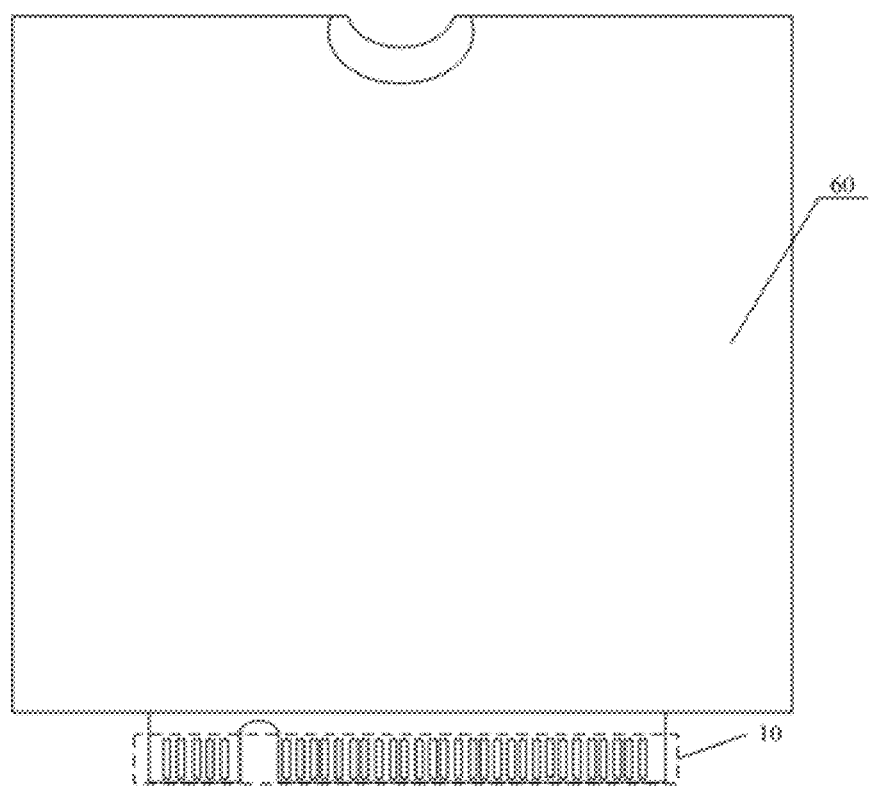
FIG. 3 depicts a rear structural view of the communication module provided in the present invention.

As shown in FIGS. 1 to 3, a communication module may include a PCB board 60, a NGFF (Next Generation Form Factor) interface 10, a switch unit 20, a charge protection unit 30 and a delay unit 40. The NGFF interface 10 may be a is the new generation interface standard tailored by Intel for ultra-books. The NDFF interface 10 may allow a size of a communication module to be, for example, 42 mm×22 mm, thickness with single side element layout of 2.75 mm, and thickness with double side element layout of 3.85 mm. As a result, a size of the NGFF interface 10 may be smaller than a size of a Mini-PCIe interface. Thereby, an associated communication module may include features such as small size, interface standardization and may support hot plugging and/or unplugging.

More specifically, a NGFF interface 10, a switch unit 20, a charge protection unit 30 and a delay unit 40 may be arranged on a PCB board 60. The NGFF interface 10 may be an interface with connecting finger, and may be located at one end of the PCB board 60. This configuration may allow the communication module to be plugged into a portable terminal (such as mobile phone, tablet computer, and other types of terminals) through the NGFF interface 10, and connected to a control system in the portable terminal. Thereby, the portable terminal may achieve connection to a network.

The NGFF interface 10 may include a power supply pin 101 and a universal serial bus (USB) data transmission pin 102. The switch unit 20, the charge protection unit 30 and the delay unit 40 may be connected to the power supply pin 101 of the NGFF interface 10. The switch unit 20 may be connected to a power supply end J1 of the communication module through the charge protection unit 30. The switch unit 20 may be for controlling connection and/or disconnection of electric power between the power supply end J1 of the communication module and the power supply pins 101. The charge protection unit 30 may be for power charging when the switch unit 20 is turned off, and may be for eliminating an impact current generated at an instant when the switch unit 20 is turning on. The delay unit 40 may be for controlling a turn on delay of the switch unit 20. In addition, within a pre-determined delay time period (i.e., during the time period when the switch unit 20 is off), by virtue of the charge protection unit 30, a small current charging may have been produced, which may eliminate an impact current that, may otherwise, be generated when the switch unit 20 is turned on, thus prevents the switch unit 20 from being damaged. It should be noted that the switch unit 20, the charge protection unit 30, and the delay unit 40 may be added to a communication module, other communication module components may be similar to components in existing technologies; and thus the other components are not described in detail herein.

Figure 4:
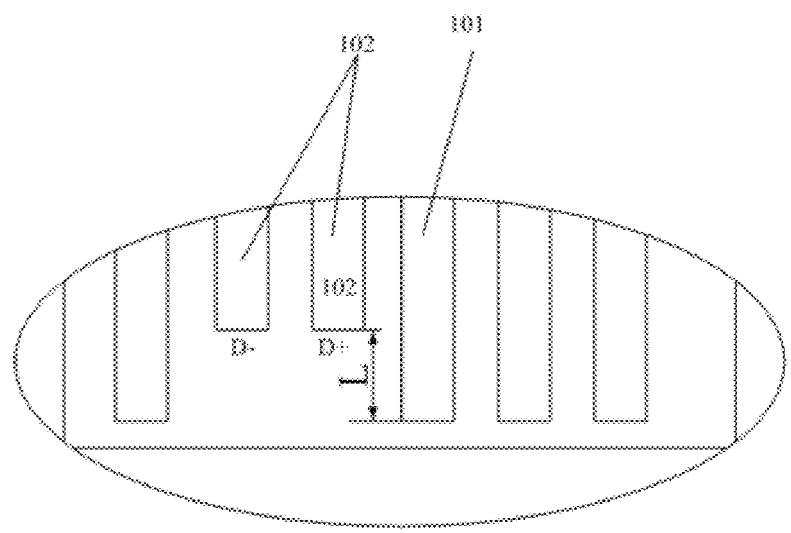
FIG. 4 depicts an enlarged schematic view of the part A shown in FIG. 2.

With reference to FIGS. 2-4, a USB data transmission pin 102 of a NGFF interface 10 may include a positive data transmission pin D+ and a negative data transmission pin D−. In order to avoid data loss or saving failure during hot plugging or unplugging, the USB data transmission pin 102 may be shorter than a power supply pin 101. For example, the USB data transmission pin 102 may be shorter than other pins (including the power supply pin 101) on the same NGFF interface 10. The USB data transmission pin 102 may be arranged at a front side of the PCB board 60. All other pins on the same front side, and on a back side, of the PCB board 60 may maintain pin length of a standard NGFF interface 10.

In one exemplary embodiment, a length of the universal serial bus (USB) data transmission pin 102 may be two thirds of a length of a power supply pin 101±0.1 mm. A length of the universal serial bus (USB) data transmission pins may be shorter than or equal to two thirds of a length of the power supply pins+0.1 mm. Thereby, when the communication module is plugging into a device, the power supply pin 101 may be connected to the power supply pin of the device, such that the entire system may be powered on and may start to work before a positive data transmission pin D+ and/or a negative data transmission pin D− are respectively connected to a positive data transmission pin D+ and a negative data transmission pin D− on an associated NGFF connector, so as to start USB communication after the communication module is powered up. In this way, the CPU (Central Processing Unit) of the portable terminal may be able to power on the communication module in advance of communications and when a system becomes stable. Thereby, the communication module may be ready to provide USB data transmission.

When the communication module is unplugged, a positive data transmission pin D+ and/or a negative data transmission pin D− may be disconnected before electric power connections are disconnected. In other words, USB communication may be disconnected first. At this moment, a CPU is able to recognize the USB disconnection event and may save related data prior to electric power being disconnected. A power supply pin 101 of the communication module may be disconnected from a power supply pin on the NGFF connector subsequent to disconnection of the data connections, which may power off the communication module. In practice, lengths of a positive data transmission pin D+ and a negative data transmission pin D− may be shorter than a length of other pins (including the power supply pin 101) by L; and L may be, for example, 0.5 mm. Such length difference may vary according to different plugging and unplugging speeds. A time when the power supply pin 101 is disconnected may be delayed about a few hundred ms (millisecond) from a time when the USB data transmission pin 102 is disconnected. As a result, there may be a time period of a few hundred ms after the USB data transmission pin 102 is disconnected from the NGFF connector and before the power supply pin 101 is disconnected from a power supply pin on the NGFF connector. Within this time period, the CPU may have sufficient time to handle a USB disconnection event, as well as, save related data. Thereby, before the communication module is powered off, the CPU may have already saved all the data and stopped data transmission. In this way, problems in the existing technologies, such as data loss and saving failure, resulting from power off, and data transmission disconnection, may be avoided. Accordingly, integrity and accuracy of data may be improved.

In order to avoid generation of a large instantaneous current, at a NGFF connector of the smart terminal, when the communication module is plugged in, the switch unit 20 may be employed to disconnect an electric power connection between a power supply end J1 of the communication module and a power supply pin 101, which may prevent the communication module from an impact of a large instantaneous current. When the large instantaneous current disappears, the switch unit 20 may further connect the electric power between the power supply end J1 of the communication module and the power supply pin 101.

Figure 5:
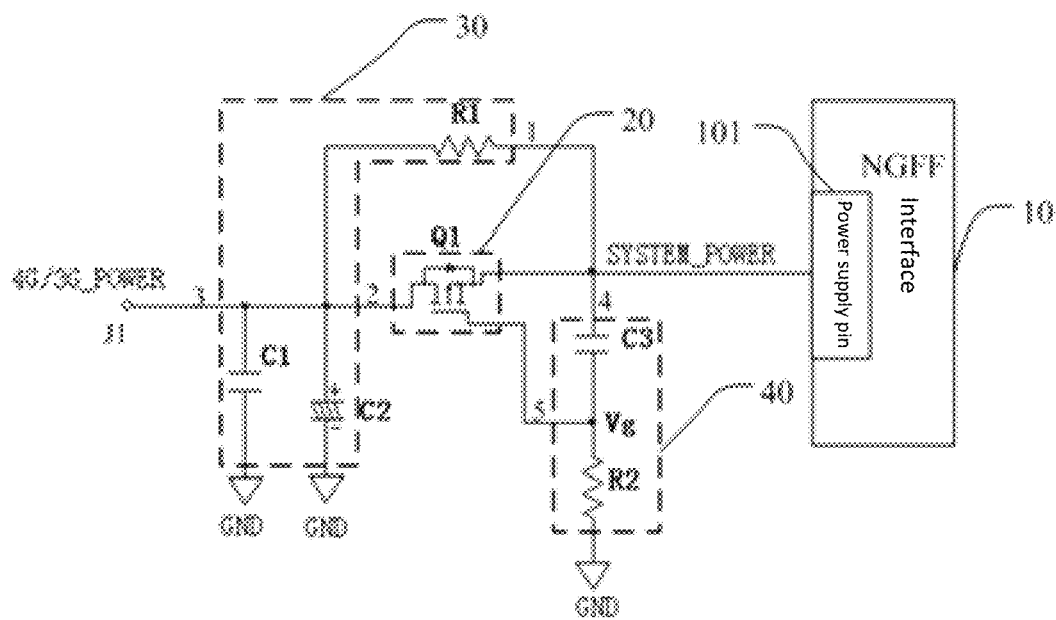
FIG. 5 depicts a circuit diagram of the communication module provided in the present invention.

With reference to FIGS. 1 and 5, the switch unit 20 may be a MOS (Metal Oxide Semiconductor) tube Q1. A source electrode of the MOS tube Q1 may be connected to a power supply pin 101 of a NGFF interface 10, a first input end 1 of a charge protection unit 30, and a first end 4 of a delay unit 40. A gate electrode of the MOS tube Q1 may be connected to a second end 5 of the delay unit 40. A drain electrode of the MOS tube Q1 may be connected to a second input end 2 of the charge protection unit 30. In addition, an output end 3 of the charge protection unit 30 may be connected to a power supply end J1 of a communication module.

A system power SYSTEM_POWER provided by a power supply pin of a control system's NGFF connector may be applied, via a power supply 101 of a NGFF interface 10, to a source electrode of the MOS tube Q1, a first input end 1 of the charge protection unit 30 and a first end 4 of the delay unit 40. In practice, the MOS tube Q1 may be a PMOS (Positive channel Metal Oxide Semiconductor) tube. When a gate electrode of the MOS tube Q1 is inputted with a low electrical level, the MOS tube Q1 may become open. When the gate electrode of the MOS tube Q1 is inputted with a high electrical level, the MOS tube Q1 may be shut off.

The charge protection unit 30 may be used for performing small current charging when the switch unit 20 is turned off, so as to eliminate an impact current, that may be otherwise generated at a moment when the switch unit 20 is turned on. In addition, through such charging, a voltage of the power supply end J1 of the communication module may increase. When the voltage at the power supply end J1 4G/3G_Power is equal to, or close to, the voltage of the system power SYSTEM_POWER, the MOS tube Q1 may be open. In such case, an impact current, generated at the switch unit, may be reduced, and thus may have minimal impact on system power supply.

A charge protection unit 30 may include a first resistor R1, a first capacitor C1, and a second capacitor C2. One end (first connection end) of the first resistor R1 may be connected to a source electrode of a MOS tube Q1, a power supply pin 101 of a NGFF interface 10, and a first end 4 of a delay unit 40. Another end (second connection end) of the first resistor R1 may be connected to a drain electrode of the MOS tube Q1, one end of the first capacitor C1, a positive electrode of the second capacitor C2, and a power supply end J1 of the communication module. In addition, both another end of the first capacitor C1 and a negative electrode of the second capacitor C2 may be grounded. In order to control a charging current and charging time of the charge protection unit 30, a resistance of the first resistor R1 may be, for example, 20Ω. The first capacitor C1 may be a filter capacitor for filtering out high frequency and pulse interferences. A capacitance of the first capacitor C1 may be, for example, 100 pF. The second capacitor C2 may be a large capacitor for charging and controlling pulse power consumption within a suitable range. A capacitance of the second capacitor may be, for example, 150 pF.

The delay unit 40 may be used for controlling an open time delay of the MOS tube Q1. More specifically, the delay unit 40 may include a second resistor R2 and a third capacitor C3. One end (third connection end) of the second resistor R2 may be connected to a gate electrode of the metal oxide semiconductor MOS tube Q1. In addition, via the third capacitor C3, the one end (third connection end) the second resistor R2 may also be connected to one end (first connection end) of the first resistor R1, a source electrode of the MOS tube Q1, and a power supply pin 101 of the NGFF interface 10. Another end (fourth connection end) of the second resistor R2 may be grounded. A voltage at a connection point between the second resistor R2 and the third capacitor C3 may be denoted as Vg.

Respective values of the first resistor R1, the second resistor R2, the second capacitor C2, the third capacitor C3 may, for example, meet the requirements set forth below: a time constant between the first resistor R1 and the second capacitor C2 may be smaller than a time constant between the second resistor R2 and the third capacitor C3. After the second capacitor C2 has been fully charged and the power supply voltage 4G/3G_Power of the communication module is equal to, or close to, the system power SYSTEM_POWER, the third capacitor C3 may finish a negative charging, i.e., the voltage Vg drops to a threshold voltage of the MOS tube Q1. Fully charging of the second capacitor C2 may be because, when the power supply voltage 4G/3G_Power is equal to or close to the system power SYSTEM_POWER, electric current may flow from the system power SYSTEM_POWER to the power supply voltage 4G/3G_Power is very small. In such case, when the MOS tube Q1 is open, the second capacity C2 may avoid generation of a large instantaneous current which may have otherwise occurred during plugging, when a SYSTEM_POWER of a certain voltage may be transferred to the 4G/3G_POWER of 0 V. Thus, an impact of an instantaneous current to the MOS tube Q1 may be very small. Accordingly, elements in a power module of the communication module may not be burned, and the instantaneous current influence on communication module power may also be reduced. In this regard, based on values of the first resistor R1 and the second capacitor C2, a resistance of the second resistor R2 may be, for example, 220 KΩ, and a capacitance of the third capacitor C3 may be, for example, 1 uF.

Using a 4G/3G communication module, plugged into a tablet computer as an example, and in reference to FIG. 5, a process of avoiding and limiting a large current generated during communication module plugging, may include a system power of the tablet computer SYSTEM_POWER connected to a source electrode of a MOS tube Q1 of the 4G/3G module through an NGFF interface 10. The MOS tube Q1 may function as a switch of a power supply of the 4G/3G module. At the moment when the 4G/3G module is connected to the system power SYSTEM_POWER, due to the property of capacitor, a voltage between two ends of a third capacitor C3 may be free of a sudden change. Vg, a voltage at a connection point between the third capacitor C3 and a second resistor R2, is SYSTEM_POWER. Thus, a voltage of a gate electrode of the MOS tube Q1 may be SYSTEM_POWER. At a point in time when the 4G/3G module is connected to system power SYSTEM_POWER, both the voltage of the gate electrode and the voltage of the source electrode may be SYSTEM_POWER, and the MOS tube Q1 may be in a cut off state. Moreover, during this time period, the system power SYSTEM_POWER may perform small current charging to the first capacitor C1 and the second capacitor C2 through the first resistor R1, and SYSTEM_POWER charging current may be (SYSTEM_POWER−4G/3G_POWER)/R1. When the voltage Vg drops to a value equal to a switch threshold voltage of the MOS tube Q1, the MOS tube Q1 may be open, since an internal resistance in the MOS tube Q1 may be very small, and thus may be negligible. A power supply end J1 of the communication module could be considered as a power supply pin directly connected to the system power SYSTEM_POWER. In other words, the voltage of 4G/3G_POWER may be equal to, or close to, the voltage of SYSTEM_POWER. Accordingly, a time delay constant t of the MOS tube Q1 can be determined through adjusting the values of the second resistor R2 and the third capacitor C3, t=R2×C3×ln((SYSTEM_POWER−Vg)/SYSTEM_POWER), so as to make, when the MOS tube Q1 is open, the voltage of 4G/3G_POWER equal to, or close to, the voltage of SYSTEM_POWER. In this case, a switch impact current may be at a lowest level, which may have the smallest impact to the system power.

A radio frequency (RF) pin 103 of the NGFF interface 10 may undergo treatment, so as to reduce radio frequency signal attenuation. In reference to FIGS. 2 and 3, the NGFF interface 10 may include at least one radio frequency (RF) pin 103 and at least two ground pins 104. The ground pins 104 may be arranged at two sides of the radio frequency (RF) pin 103. The radio frequency (RF) pin 103 may be provided on a front side of a PCB board 60. As shown in FIG. 2, for each radio frequency (RF) pin 103, there may be two ground pins 104 being respectively arranged at left and right sides of the radio frequency (RF) pin.

A terminal of the NGFF interface 10 may be quite small. Accordingly, a terminal distributed capacitance, distributed inductance and other parameters may also be small. Thus, the terminal may have relatively small impact on the radio frequency signal. In addition, pins for the NGFF interface 10 may be gold plated or treated with chemical gold deposition, and thus may have small attenuation for the radio frequency signal. Moreover, ground pins may be arranged at two sides of a radio frequency (RF) pin, thus the ground pins may also play a role for shielding and protecting the radio frequency signal.

In practice, a USB data transmission pin 102 may be a USB 2.0 pin with a standard NGFF interface, while the radio frequency (RF) pin 103 and a portion of the ground pins 104 may be USB 3.0 pins with a standard NGFF interface. In order to minimize attenuation of radio frequency signal, a quantity of the ground pins 104 may be over two times a quantity of the radio frequency (RF) pins 103. In addition, for each radio frequency (RF) pin, there may be two ground pins arranged at each of two sides of the radio frequency (RF) pin. In other words, two ground pins 104 may be provided in between two radio frequency (RF) pins 103. As shown in FIG. 2, for each radio frequency (RF) pin 103, there may be two ground pins 104 arranged at each of the radio frequency (RF) pin two sides. Definitions of all other pins on the NGFF interface 10 may identical to the definitions of other pins on a standard NGFF interface 10. For example, technical documents about a standard NGFF interface may provide definitions of all other pins.

A PCB board 60 of a communication module may be provided with an electronic components layout area (not shown in the drawings). Electronic elements may be arranged in this electronic components layout area. In addition, in order to reduce signal interference, a shield 50 may be provided on the PCB board 60. The shield 50 may be arranged to shield the electronic components layout area.

A portable terminal may include a control system and a communication module. The communication module may include a NGFF interface. The communication module may be plugged into a NGFF connector in the control system through a NGFF interface, so as to be connected to a network.

For example, when the communication module is a 3G module or 4G module, the communication module may also include power elements which have relatively greater height (such as, a large capacitor, power components, DC/DC power supply for DC to DC conversion, and the like) or structural elements which have relatively bigger size (such as, a SIM (Subscriber Identity Module) slot, a SD (Secure Digital) slot, a connector, and the like). In current 3G module or 4G module, these power elements and structural elements are all arranged on the PCB board of the 3G module or 4G module, which makes the communication module have a quite big volume.

A communication module of the present disclosure, on the other hand, may adopt a NGFF interface with a new generation of an interface standard, which has been tailored by Intel for ultra-books. The new generation interface standard allows a size of a 3G module and/or a 4G module to be 42 mm×22 mm. In addition, in order to reduce a thickness of the 3G module or 4G module, the above mentioned power elements and structural elements may be arranged in the control system (i.e., the power elements and structural elements may be arranged on a PCB board of the control system), and may be electrically connected to the control circuit on the PCB board of the communication module through an NGFF interface. In this way, a thickness with single side element layout may be 2.75 mm, and a thickness with double side element layout may be 3.85 mm. As a result, a size of an associated communication module may be significantly reduced.

With respect to existing technologies, the communication modules and portable terminals of the present disclosure may have the beneficial effects set forth below:

1. An interface of the communication module may be a small sized NGFF interface, which may render communication module features small size and interface standardization, and the like.

2. The communication module may adopt a NGFF interface of a size of 42 mm×22 mm. Thus, a communication module thickness with single side element layout may be 2.75 mm, and a thickness with double side element layout may be 3.85 mm. The elements (such as, power elements, structural elements and other elements, whose height cannot be reduced) with relatively greater height may be arranged in the control system beyond the communication module, so as to effectively reduce the thickness of the communication module.

3. In the NGFF interface, ground pins may be arranged at two sides of a radio frequency (RF) pin, so as to reduce radio frequency signal attenuation, as well as to shield and protect the radio frequency signal.

4. In the NGFF interface, a universal serial bus (USB) data transmission pin may be shorter than a power supply pin. Accordingly, when the communication module is being connected to the control system, the power supply may be first connected, before associated data pins, and thus the system may start to work before a USB data transmission pin is connected, so the USB communication may be initiated after the system begins working. On the other hand, when the communication module is being unplugged, the USB data transmission pin may be disconnected first before associated electric power is disconnected, which may result in the USB communication being disconnected first, and when the USB communication is disconnected, the control system CPU may process the USB disconnection event and accordingly save related data. In this way, the NGFF interface may support hot plugging and unplugging. Further, with providing the communication module with a switch unit, a charge protection unit and a delay unit, the communication module may be protected during a hot plugging and unplugging, and may avoid and limit the generation of large instantaneous current, when the communication module is being hot plugged or unplugged, so as to protect the power of the communication module, and prevent the power of communication module from crash.

Based on the technical solution and inventive conception of the present disclosure, a person of ordinary skill in the art may be able to make alternations and/or modifications, and all these modifications and alternations are within the scope of the appended claims.

The invention claimed is:

1. A communication module, comprising:
an NGFF interface, including
  power supply pins; and
  universal serial bus (USB) data transmission pins;
    wherein a length of the universal serial bus (USB) data transmission pins is shorter than a length of the power supply pins;
a switch unit for controlling connection and disconnection of electrical power between a power supply end of the communication module and the power supply pins;
a charge protection unit for power charging when the switch unit is turned off, and for eliminating an impact current generated at an instant when the switch unit is turning on; and
a delay unit for controlling a switch unit turn on delay;
wherein the switch unit, the charge protection unit and the delay unit are connected to the power supply pins of the NGFF interface, and wherein the switch unit is connected to the power supply end of the communication module through the charge protection unit;
wherein the switch unit is a metal oxide semiconductor;
wherein a source electrode of the metal oxide semiconductor is connected to the power supply pins of the NGFF interface, a first input end of the charge protection unit, and a first end of the delay unit, and wherein a gate electrode of the metal oxide semiconductor is connected to a second end of the delay unit, a drain electrode of the metal oxide semiconductor is connected to a second input end of the charge protection unit;
wherein the charge protection unit comprises:
a first resistor;
a first capacitor; and
a second capacitor;
wherein a first connection end of the first resistor is connected to the source electrode of the metal oxide semiconductor, the power supply pins of the NGFF interface and the first end of the delay unit, wherein a second connection end of the first resistor is connected to the drain electrode of the metal oxide semiconductor, one end of the first capacitor, a positive electrode of the second capacitor and the power supply end of the communication module, and
wherein both another end of the first capacitor and a negative electrode of the second capacitor are grounded.

2. The communication module as in claim 1, wherein the delay unit comprises:
a second resistor; and
a third capacitor;
wherein a third connection end of the second resistor is connected to the gate electrode of the metal oxide semiconductor, wherein, via the third capacitor, the third connection end of the second resistor is connected to the first connection end of the first resistor, the source electrode of the metal oxide semiconductor, and the power supply pins of the NGFF interface, and wherein a fourth connection end of the second resistor is grounded.

3. The communication module as in claim 1, wherein the NGFF interface comprises:

at least one radio frequency (RF) pin; and
at least two ground pins;
wherein the ground pins are arranged at two sides of the radio frequency (RF) pin.

4. The communication module as in claim 3, wherein for each radio frequency (RF) pin, there are two ground pins arranged at each of the two sides of the radio frequency (RF) pin.

5. The communication module as in claim 1, wherein the length of the universal serial bus (USB) data transmission pins is longer than or equal to two thirds of the length of the power supply pins−0.1 mm, and is shorter than or equal to two thirds of the length of the power supply pins+0.1 mm.

6. The communication module as in claim 1, wherein the communication module also comprises:
a printed circuit board (PCB) having an electronic components layout area, and a shield covering the electronic components layout area.

* * * * *